(12) United States Patent
Vuorinen et al.

(10) Patent No.: US 12,149,863 B2
(45) Date of Patent: Nov. 19, 2024

(54) ARRANGEMENT FOR CONTROLLING POWER CONSUMPTION

(71) Applicant: Teleste Oyj, Littoinen (FI)

(72) Inventors: Jonne Vuorinen, Hevonpää (FI); Mika Rintalaulaja, Kaarina (FI); Kari Mäki, Turku (FI)

(73) Assignee: Teleste Oy, Littoinen (FI)

( * ) Notice: Subject to any disclaimer, the term of this patent is extended or adjusted under 35 U.S.C. 154(b) by 51 days.

(21) Appl. No.: 18/026,386

(22) PCT Filed: Sep. 21, 2020

(86) PCT No.: PCT/FI2020/050606
§ 371 (c)(1),
(2) Date: Mar. 15, 2023

(87) PCT Pub. No.: WO2022/058643
PCT Pub. Date: Mar. 24, 2022

(65) Prior Publication Data
US 2023/0388450 A1 Nov. 30, 2023

(51) Int. Cl.
*H04N 7/10* (2006.01)
*H04N 7/035* (2006.01)
*H04N 17/00* (2006.01)

(52) U.S. Cl.
CPC ............. *H04N 7/104* (2013.01); *H04N 7/035* (2013.01); *H04N 17/004* (2013.01)

(58) Field of Classification Search
CPC ...... H04N 7/035; H04N 7/104; H04N 17/004; H04N 21/6118; H04N 21/6168
See application file for complete search history.

(56) References Cited

U.S. PATENT DOCUMENTS 4,920,233 A * 4/1990 Kincaid ............... H01B 11/146
  178/45
5,125,100 A * 6/1992 Katznelson ............ H04H 20/78
  348/E7.024

(Continued)

FOREIGN PATENT DOCUMENTS

CN 108566172 A 9/2018
EP 0928063 A2 7/1999
(Continued)

OTHER PUBLICATIONS

International Application No. PCT/FI2020/050606, filed Sep. 21, 2020, International Search Report and Written Opinion, issued May 24, 2021, 16 pages.

(Continued)

*Primary Examiner* — Michael B. Pierorazio
(74) *Attorney, Agent, or Firm* — MUETING RAASCH GROUP

(57) ABSTRACT

A network element of a cable television (CATV) network, comprising an input for upstream signal transmission; one or more diplex filters (210, 212, 214) connectable to said input, the diplex filters (210, 212, 214) comprising bandpass filters for different upstream and downstream frequency bands; a plurality of components arranged to form an upstream signal path, wherein at least one of said components is an upstream amplifier (206c); means (216) for detecting a type of the diplex filter connected between said input and the upstream signal path; means (216) for determining a control signal for adjusting bias current of the upstream amplifier (206c), wherein the control signal is based on at least a type of the diplex filter; and means for adjusting the bias current of the upstream amplifier (206c) based on the control signal.

9 Claims, 1 Drawing Sheet

(56) References Cited

U.S. PATENT DOCUMENTS

| | | | | | |
|---|---|---|---|---|---|
| 5,481,389 | A * | 1/1996 | Pidgeon | | H04B 10/2933 |
| | | | | | 398/208 |
| 5,604,528 | A * | 2/1997 | Edwards | | H04N 7/1675 |
| | | | | | 380/240 |
| 5,834,697 | A * | 11/1998 | Baker | | H01B 11/02 |
| | | | | | 174/34 |
| 5,930,678 | A * | 7/1999 | Alley | | H04L 5/06 |
| | | | | | 455/69 |
| 6,466,913 | B1 * | 10/2002 | Yasuda | | G10L 21/00 |
| | | | | | 704/E21.001 |
| 6,721,371 | B1 * | 4/2004 | Barham | | H03H 17/0294 |
| | | | | | 329/363 |
| 6,990,682 | B1 * | 1/2006 | Sato | | H04N 7/102 |
| | | | | | 725/127 |
| 7,530,091 | B2 * | 5/2009 | Vaughan | | H04M 7/006 |
| | | | | | 725/127 |
| 7,883,363 | B2 * | 2/2011 | Montena | | H01R 24/44 |
| | | | | | 439/654 |
| 8,045,066 | B2 * | 10/2011 | Vorenkamp | | H01L 23/5227 |
| | | | | | 348/731 |
| 8,429,695 | B2 * | 4/2013 | Halik | | H04L 12/2801 |
| | | | | | 725/127 |
| 8,589,997 | B2 * | 11/2013 | Wells | | H04N 21/6118 |
| | | | | | 725/127 |
| 8,611,528 | B2 * | 12/2013 | Hazani | | H04B 3/542 |
| | | | | | 379/413.04 |
| 10,505,499 | B1 | 12/2019 | Bonen et al. | | |
| 2001/0046268 | A1 * | 11/2001 | Sharma | | H04J 1/05 |
| | | | | | 348/E7.069 |
| 2002/0056135 | A1 * | 5/2002 | Sharma | | H04N 7/22 |
| | | | | | 348/E7.07 |
| 2004/0244053 | A1 * | 12/2004 | Golombek | | H04N 21/6118 |
| | | | | | 725/127 |
| 2005/0056454 | A1 * | 3/2005 | Clark | | H01B 11/02 |
| | | | | | 174/113 R |
| 2006/0124342 | A1 * | 6/2006 | Clark | | H01B 11/02 |
| | | | | | 174/113 R |
| 2006/0141976 | A1 * | 6/2006 | Rohde | | H03D 7/1441 |
| | | | | | 455/326 |
| 2008/0010488 | A1 * | 1/2008 | Riggsby | | H04N 7/22 |
| | | | | | 348/E7.07 |
| 2008/0010512 | A1 * | 1/2008 | Riggsby | | H04N 21/40 |
| | | | | | 375/E7.025 |
| 2008/0022344 | A1 * | 1/2008 | Riggsby | | H04N 21/6118 |
| | | | | | 725/128 |
| 2008/0227333 | A1 * | 9/2008 | Hazani | | H01R 13/719 |
| | | | | | 439/578 |
| 2008/0231111 | A1 * | 9/2008 | Hazani | | H01R 31/065 |
| | | | | | 307/3 |
| 2010/0017842 | A1 * | 1/2010 | Wells | | H04M 11/066 |
| | | | | | 725/149 |
| 2010/0100918 | A1 * | 4/2010 | Egan, Jr. | | H04N 7/102 |
| | | | | | 725/111 |
| 2010/0125877 | A1 * | 5/2010 | Wells | | H04N 7/17309 |
| | | | | | 725/127 |
| 2010/0146564 | A1 * | 6/2010 | Halik | | H04N 7/104 |
| | | | | | 725/127 |
| 2010/0311277 | A1 * | 12/2010 | Montena | | H01R 24/44 |
| | | | | | 333/260 |
| 2011/0154429 | A1 * | 6/2011 | Stantchev | | H01Q 1/24 |
| | | | | | 343/702 |
| 2012/0151548 | A1 * | 6/2012 | Rakib | | H04N 7/22 |
| | | | | | 725/126 |
| 2013/0004179 | A1 * | 1/2013 | Nielsen | | H04B 3/50 |
| | | | | | 398/115 |
| 2013/0125193 | A1 * | 5/2013 | Wells | | H04N 21/6168 |
| | | | | | 725/127 |
| 2013/0227632 | A1 * | 8/2013 | Wells | | H04L 12/2801 |
| | | | | | 725/127 |
| 2014/0033264 | A1 * | 1/2014 | Li | | H04N 21/61 |
| | | | | | 725/127 |
| 2017/0302378 | A1 * | 10/2017 | Mutalik | | H04L 12/2856 |
| 2018/0109319 | A1 * | 4/2018 | Jones | | H04B 10/564 |

FOREIGN PATENT DOCUMENTS

| | | |
|---|---|---|
| WO | WO 2017178691 A1 | 10/2017 |
| WO | WO 2019086748 A1 | 5/2019 |
| WO | WO 2020117317 A1 | 6/2020 |

OTHER PUBLICATIONS

International Application No. PCT/FI2020/050606, filed Sep. 21, 2020, Written Opinion of the International Preliminary Examining Authority, issued Nov. 14, 2022, 6 pages.

International Application No. PCT/FI2020/050606, filed Sep. 21, 2020, Written Opinion Preliminary Examining Authority, issued date Jan. 12, 2023, 7 pages.

International Application No. PCT/FI2020/050606, filed Sep. 21, 2020, International Preliminary Report on Patentability, issued Feb. 9, 2023, 14 pages.

* cited by examiner

ARRANGEMENT FOR CONTROLLING POWER CONSUMPTION

This application is the § 371 U.S. National Stage of International Application No. PCT/FI2020/050606, filed Sep. 21, 2020, the disclosure of which is incorporated by reference herein in its entirety.

FIELD OF THE INVENTION

The invention relates to cable television (CATV) networks, and especially to an arrangement for controlling power consumption of a CATV network element.

BACKGROUND

CATV networks may be implemented with various techniques and network topologies, but currently most cable television networks are implemented as so-called HFC networks (Hybrid Fiber Coax), i.e. as combinations of a fibre network and a coaxial cable network.

Data Over Cable Service Interface Specification (DOCSIS) is a CATV standard providing specifications for high-bandwidth data transfer in an existing CATV system. The latest versions DOCSIS 3.1 and 4.0 enable the cable network operators to maximize both the downstream and upstream data throughput using the existing HFC networks. One issue relating to the introduction of DOCSIS 3.1 and the forthcoming 4.0 is the need to eventually adjust the frequency range and the bandwidth of the communication channels. To support the various DOCSIS standard versions, CATV amplifiers typically need to support several different upstream-downstream frequency splits, such as 42/54 MHz, 65/85 MHz, MHz, 204/258 MHz, 300/372 MHz, 396/492 MHz, 492/606 MHz or 684/834 MHz. This may be actualized, for example, with network element having a plurality of diplex filters and return path modules for each individual split.

Due to the relatively low frequency range of upstream channels (i.e. below 65 MHz), the power consumption of upstream output amplifier components has traditionally been negligible. However, due to the introduction of significantly higher frequency ranges for upstream channels in DOCSIS 3.1 and especially in 4.0, the upstream channel load may increase even ten times from 65 MHz to 684 MHz. The increase of the channel load requires a rise of power consumption in upstream output amplifier to meet the same performance criteria as with MHz channel load.

Therefore, an improved arrangement is needed for controlling the power consumption of the upstream amplifier components in CATV amplifiers.

BRIEF SUMMARY

Now, an improved arrangement has been developed to reduce the above-mentioned problems. As aspects of the invention, we present a network element of a cable television network, which is characterized in what will be presented in the independent claims.

The dependent claims disclose advantageous embodiments of the invention.

According to an aspect of the invention, there is provided a network element of a cable television (CATV) network, said network element comprising an input for upstream signal transmission; one or more diplex filters connectable to said input, the diplex filters comprising bandpass filters for different upstream and downstream frequency bands; a plurality of components arranged to form an upstream signal path, wherein at least one of said components is an upstream amplifier; means for detecting a type of the diplex filter connected between said input and the upstream signal path; means for determining a control signal for adjusting bias current of the upstream amplifier, wherein the control signal is based on at least a type of the diplex filter; and means for adjusting the bias current of the upstream amplifier based on the control signal.

According to an embodiment, the network element comprises a plurality of diplex filters connectable to said input; and means for switching one of said plurality of diplex filters to be connected between said input and the upstream signal path.

According to an embodiment, at least one of said components is an upstream attenuator, and the network element comprises means for determining an attenuation value of the upstream attenuator and the control signal is further based on at least the attenuation value.

According to an embodiment, said network element comprises means for determining temperature compensation for gain and slope of the upstream amplifier based on the type of the diplex filter.

According to an embodiment, said network element comprises means for determining the channel load on the upstream frequency band, wherein the control signal is further based on at least the channel load.

According to an embodiment, the control signal is further based on a difference between an actual input level and a nominal input level of an upstream receiver of upstream amplifier.

According to an embodiment, the network element is configured to store a plurality of predetermined performance configurations for determining the control signal.

According to an embodiment, the plurality of predetermined performance configurations comprises one or more of the following parameters arranged according to the types of the diplex filter:
variations in channel load, such as in terms of a number and frequencies of active upstream channels;
attenuation values of the upstream attenuator for each type of the diplex filters;
a nominal input level of an upstream receiver;
a temperature compensation for each type of the diplex filters;
an indication of an optional lowpass filtering on the upstream channels for each diplex filter type.

According to an embodiment, the at least one amplifier unit is the last amplifier unit of the network element in upstream signal path.

According to an embodiment, the network element comprises a user interface means for determining the control signal for adjusting the bias current of the upstream amplifier.

According to an embodiment, said means for determining a control signal for adjusting bias current of the upstream amplifier comprises a control circuit configured to detect at least the type of the diplex filter and to adjust the bias current of the upstream amplifier based on the control signal.

These and other aspects, embodiments and advantages will be presented later in the detailed description of the invention.

BRIEF DESCRIPTION OF THE DRAWINGS

The invention will now be described in more detail in connection with preferred embodiments with reference to the appended drawings, in which.

DETAILED DESCRIPTION OF THE EMBODIMENTS

Figure 1:
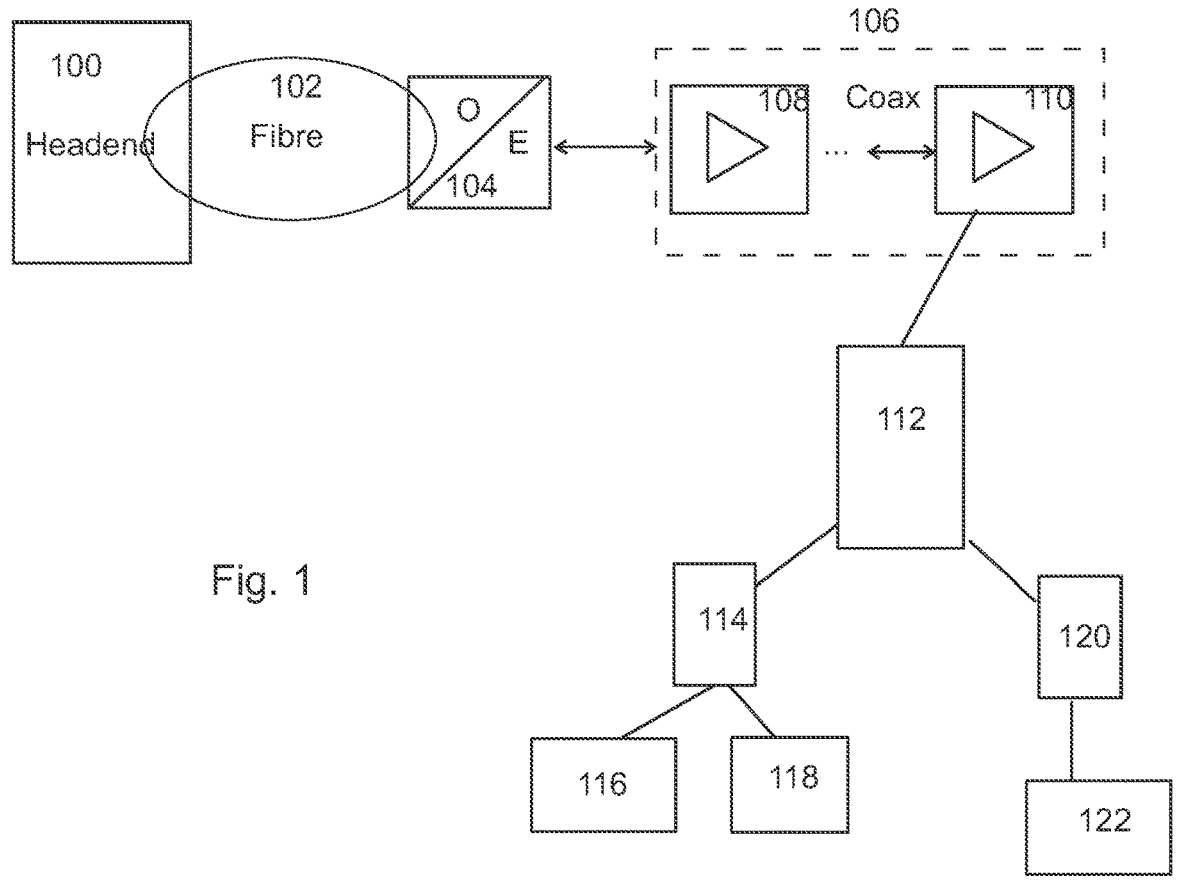
FIG. 1 shows the general structure of a typical HFC network.

FIG. 1 shows the general structure of a typical HFC network. Program services are introduced from the main amplifier 100 (a so-called headend or CCAP) of the network via an optical fibre network 102 to a fibre node 104, which converts the optical signal to an electric signal to be relayed further in a coaxial cable network 106. Such a node 104 can be analogue node or so called RPD/RMD node. Depending on the length, branching, topology, etc. of the coaxial cable network, this coaxial cable segment typically comprises one or more broadband amplifiers 108, 110 for amplifying program service signals in a heavily attenuating coaxial media. From the amplifier the program service signals are introduced to a cable network 112 of a smaller area, such as a distribution network of an apartment building, which are typically implemented as coaxial tree or star networks comprising signal splitters for distributing the program service signals to each customer. The cable network 112, such as the distribution network of an apartment, may further comprise a Network Interface Unit (NIU) or Point of Entry (PoE) device arranged to divide signals to appropriate home appliances. The NIU may operate as a home amplifier. From a wall outlet the signal is further relayed either via a cable modem 114 to a television receiver 116 or a computer 118, or via a so-called set-top box 120 to a television receiver 122.

The HFC network may be implemented according to various standards. In Europe, the HFC networks have traditionally been implemented according to DVB-C (Digital Video Broadcasting-Cable) standard, but currently there is an on-going shift to more widely use the DOCSIS (Data Over Cable Service Interface Specification) standard.

DOCSIS is a CATV standard providing specifications for high-bandwidth data transfer in an existing CATV system. DOCSIS may be employed to provide Internet access over existing hybrid fiber-coaxial (HFC) infrastructure of cable television operators. DOCSIS has been evolved through versions 1.0, 1.1, 2.0, 3.0 and 3.1 to the latest version of 4.0.

When implementing the HFC network of FIG. 1 according to DOCSIS, the headend 100 of the CATV network comprises inputs for signals, such as TV signals and IP signals, a television signal modulator and a cable modem termination system (CMTS). The CMTS provides high-speed data services to customers thorough cable modems (CM; 114) locating in homes. The CMTS forms the interface to the IP-based network over the Internet. It modulates the data from the Internet for downstream transmission to homes and receives the upstream data from homes. The CMTS additionally manages the load balancing, error correction parameters and the class of service (CoS).

Signals from the headend 100 are distributed optically (fiber network 102) to within the vicinity of individual homes, where the optical signals are converted to electrical signals at the terminating points 104. The electrical signals are then distributed to the various homes via the existing 75 ohm coaxial cables 106. The maximum data transfer of the coaxial cables is limited due to strong frequency-based attenuation. Therefore, the electrical signals transmitted over coaxial cables must be amplified. The amplifiers 108, 110 used for this purpose are suited to a specific frequency range.

In addition, the upstream and downstream must occur over the same physical connection. The last part 112 of the coaxial connection between the CMTS and the CMs branches off in a star or a tree structure. A CMTS transmits the same data to all CMs located along the same section of cable (one-to-many communications). A request/grant mechanism exists between the CMTS and the CMs, meaning that a CM needing to transmit data must first send a request to the CMTS, after which it can transmit at the time assigned to it.

Depending on the version of DOCSIS used in the CATV network, there is a great variety in options available for configuring the network. For the downstream channel width, all versions of DOCSIS earlier than 3.1 use either 6 MHz channels (e.g. North America) or 8 MHz channels (so-called "EuroDOCSIS"). However, the upstream channel width may vary between 200 kHz and 3.2 MHz (versions 1.0/1.1), and even to 6.4 MHz (version 2.0). 64-QAM or 256-QAM modulation is used for downstream data in all versions, but upstream data uses QPSK or 16-level QAM (16-QAM) for DOCSIS 1.x, while QPSK, 8-QAM, 16-QAM, 32-QAM, 64-QAM and 128-QAM are used for DOCSIS 2.0 & 3.0.

DOCSIS 3.1 specifications support capacities of at least 10 Gbit/s downstream and 1 Gbit/s upstream using 4096 QAM. DOCSIS 3.1 rejects the 6 or 8 MHz wide channel spacing and uses narrower orthogonal frequency-division multiplexing (OFDM) subcarriers being 20 kHz to 50 kHz wide, which sub-carriers can be combined within a block spectrum of maximum of 192 MHz wide.

DOCSIS 3.1 further provides the concept of Distributed CCAP Architecture (DCA). Converged Cable Access Platform (CCAP) may be defined as an access-side networking element or set of elements that combines the functionality of a CMTS with that of an Edge QAM (i.e. the modulation), providing high-density services to cable subscribers. Conventionally, the CCAP functionalities have been implemented in the headend/hub, such as the headend 100 in FIG. 1. In a DCA, some features of the CCAP are distributed from headend/hub to the network elements closer to the customers, for example to the fibre nodes 104 in FIG. 1. The CCAP functionalities left to be implemented in the headend/hub may be referred to as CCAP core.

DOCSIS 3.1 specifies at least two network element concepts, i.e. a Remote PHY Device (RPD) and a Remote-MACPHY Device (RMD), to which some functionalities of the headend can be distributed. A recent version of DOCSIS 3.1 specification also provided Annex F introducing a Full Duplex DOCSIS 3.1 technology, where a new distributed access node called Full Duplex (FDX) Node is determined. These network elements implementing at least part of the CCAP functionalities may be referred to as DCA nodes.

One issue relating to the introduction of DOCSIS 3.1 and 4.0 is the need to eventually adjust the frequency range and the bandwidth of the communication channels to meet the requirements of faster communication. The older DOCSIS standards up to the version 3.0 provide an upstream bandwidth of 5-42 MHz (in Americas) or 5-65 MHz (in Europe) and a downstream bandwidth of 85-862 MHz or even up to 1.2 GHz. In DOCSIS 3.1, the upper frequency edge of the upstream bandwidth is raised to 204 MHz, causing the lower frequency edge of the downstream bandwidth to be raised to 258 MHz. DOCSIS 4.0 will shift the upper frequency edge of the upstream bandwidth even to 684 MHz, whereupon the lower frequency edge of the downstream bandwidth to be raised to 834 MHz.

However, regardless of CATV standard underlying the HFC network, the operational principle of the RF amplifiers, such as the amplifiers 108, 110, is similar in that sense that they must be capable of two-way transmission and amplification of both downstream and upstream (a.k.a. forward path and return path) signals.

To support the various DOCSIS standard versions, CATV amplifiers typically need to support several different upstream-downstream frequency splits, such as 42/54 MHz, 65/85 MHz, 85/108 MHz, 204/258 MHz, 300/372 MHz, 396/492 MHz, 492/606 MHz or 684/834 MHz. This may be actualized, for example, with one or more diplex filters, such as plug-in diplex filters, and return path modules for each individual split. Diplex filter frequency range has almost no affect to downstream channel load, since even in the older standards the most power consuming channels appear on the higher frequencies, i.e. on several hundreds of MHz. Due to the relatively low frequency range of upstream channels (i.e. below 65 MHz), the power consumption of upstream output amplifier components has not traditionally been significant. Consequently, the power consumption of the upstream amplifier components in CATV amplifiers has not been an issue for major attention.

However, due to the introduction of significantly higher frequency ranges for upstream channels in DOCSIS 3.1 and especially in 4.0, the upstream channel load may increase even ten times from 65 MHz to 684 MHz. This means that the total composite power increases 10 dB. The increase of the channel load requires a rise of power consumption in upstream output amplifier to meet the same performance criteria as 65 MHz channel load.

Therefore, an improved arrangement is presented herein for controlling the power consumption of the upstream amplifier components in CATV network elements.

According to an aspect, a network element of a cable television (CATV) network is now introduced, said network element comprising an input for upstream signal transmission; one or more diplex filters connectable to said input, the diplex filters comprising bandpass filters for different upstream and downstream frequency bands; a plurality of components arranged to form an upstream signal path, wherein at least one of said components is an upstream amplifier; means for detecting a type of the diplex filter connected between said input and the upstream signal path; means for determining a control signal for adjusting bias current of the upstream amplifier, wherein the control signal is based on at least a type of the connected diplex filter; and means for adjusting the bias current of the upstream amplifier based on the control signal.

Hence, the implementation of the network element is based on adjusting the bias current of the upstream amplifier based on the control signal, wherein the control signal is dependent on the type of the diplex filter currently selected for use. The network element may comprise one or more diplex filters. Especially, if the network element comprises a place for only one diplex filter, such as a plug-in filter, a change to another diplex filter, such as to a diplex filter having different upstream and downstream frequency bands, is typically carried out manually. Thus, upon a technician changing the diplex filter, the type of the newly connected diplex filter is automatically detected by the network element. The type of the diplex filter may comprise, for example, at least an exact information of the maximum useable upstream bandwidth.

Information about the type of the connected diplex filter may be stored in the network element, e.g. in a memory connected to a processing unit, such as a CPU. Alternatively, the headend or the CCAP core may be configured to remotely monitor the used diplex filter and the headend or the CCAP core may be configured to send the information about the type of the diplex filter e.g. to the processing unit, such as a CPU, of the network element. Based on the type of the diplex filter, the processing unit, for example, may determine an appropriate control signal for adjusting the bias current of the upstream amplifier. The appropriate bias current adjustment, in turn, optimizes the power consumption of the upstream amplifier as low as possible, while still ensuring the upstream amplifier to operate in its dynamic region for the whole upstream frequency band of the selected diplex filter.

According to an embodiment, network element comprises a plurality of diplex filters connectable to said input; and means for switching one of said plurality of diplex filters to be connected between said input and the upstream signal path.

Consequently, the network element may comprise a plurality of pre-installed diplex filters, such as a first diplex filter comprising bandpass filters for a first upstream frequency band and a first downstream frequency band and a second diplex filter comprising bandpass filters for a second upstream frequency band and a second downstream frequency band. The network element may be provided with a switch or a corresponding logic for selecting the diplex filter to be used and for connecting the selected diplex filter to the input such that the upstream signal path travels through the selected filter. The switch may be locally controllable, e.g. using a button or a UI of the network element, or remotely controllable, e.g. by control signaling from a headend or a CCAP. Hence, instead changing the diplex filter manually, the network element may be controlled to switch one or the pre-installed plurality of diplex filter to be used, whereupon the type of switched diplex filter is automatically detected and the bias current of the upstream amplifier is adjusted by a control signal based on the type of the diplex filter.

Thus, determining the appropriate control signal based on the type of the diplex filter, such as based on the frequency range of upstream filter, may be considered a rough-scale adjustment of the bias current of the upstream amplifier. However, when the frequency ranges of the upstream signals extend to higher frequencies, such as in DOCSIS 3.1 and especially in DOCSIS 4.0, it becomes more relevant to take into account the dynamic range of the upstream amplifier, as well as the channel load at each moment. It is therefore important to continuously adjust the bias current such that the upstream amplifier remains in its dynamic region and does not drive the amplifier unit to saturate or to operate in a non-optimal operating region. This provides one type of fine-tuning of the bias current of the upstream amplifier within the selected frequency range of upstream filter.

According to an embodiment, at least one of said components is an upstream attenuator, and the network element comprises means for determining an attenuation value of the upstream attenuator and the control signal is further based on at least the attenuation value. In addition to at least one upstream amplifier, the upstream signal path within the network element may typically comprise an attenuator, which together with the amplifier may be used to adjust e.g. the gain and/or the slope of the upstream signal. Thus, the attenuation value may have effect to the required amplification of the amplifier, which in turn reflects to the value of required bias current. The attenuation value provides a further type of fine-tuning of the bias current of the upstream amplifier within the selected frequency range of upstream filter.

According to an embodiment, the network element comprises means for determining temperature compensation for gain and slope of the upstream amplifier based on the type of the diplex filter. For example, the upper frequency edge of the upstream signal band of the connected diplex filter may control the values of the gain and the slope of the upstream amplifier such that an appropriate temperature compensation is taken into account. Similarly to the attenuation value, the applied temperature compensation may have effect to the required amplification of the amplifier, which in turn reflects to the value of required bias current. Thus, the temperature compensation also provides a further type of fine-tuning of the bias current of the upstream amplifier within the selected frequency range of upstream filter.

According to an embodiment, said network element comprises means for determining the channel load on the upstream frequency band, wherein the control signal is further based on at least the channel load. The parameters of the components in the upstream signal path need to be dimensioned such that they can handle the worst-case situation of the whole frequency area being loaded with active channels at maximum output level. On the other hand, in typical real-life use-cases there are a number of unallocated upstream channels in the upstream channel raster of the network and/or the output RF power level is not even close to maximum. This would allow running the upstream amplifiers with smaller bias current and thus lowering the power consumption of the device. The channel load provides a further type of fine-tuning of the bias current of the upstream amplifier within the selected frequency range of upstream filter.

According to an embodiment, the control signal is further based on a difference between an actual input level and a nominal input level of an upstream receiver of the upstream amplifier. Especially in a situation, where the actual input level is higher than the nominal input level of the upstream receiver of the upstream amplifier, the bias current adjusted merely based on the type of the diplex filter may not be sufficient for controlling the upstream amplifier to operate in an optimal dynamic region, which may increase the power consumption. Herein, the further adjustment based on the difference between the actual input level and the nominal input level of the upstream receiver of the upstream amplifier provides another further type of fine-tuning of the bias current of the upstream amplifier within the selected frequency range of upstream filter.

According to an embodiment, the network element is configured to store a plurality of predetermined performance configurations for determining the control signal. Thus, for selecting or determining the appropriate control signal for adjusting the bias current of the upstream amplifier, the network element may comprise a plurality of predetermined performance configurations stored, e.g. in a memory of the network element. The performance configurations may be specific for each network element, and they may be tested and stored, for example, during the manufacturing phase of the network element, or upon installing the network element in the CATV network.

The plurality of predetermined performance configurations may be stored e.g. in a form of a matrix or as a look-up table, and they may include one or more parameters including the types of the diplex filter (including the upstream frequency range), possible variations in channel load e.g. in terms of a number and frequencies of active upstream channels, different attenuation values of the upstream attenuator, and a nominal input level of an upstream receiver. The parameters may further include a suitable temperature compensation for each type of the diplex filters, as well as an indication of an optional lowpass filtering on the upstream channels, the need of which being possibly dependent on the connected diplex filter type.

The plurality of predetermined performance configurations may include the value of the control signal for each permutation of the stored parameters, whereupon determining the appropriate parameter values from the matrix or the look-up table, the value of the control signal for adjusting the bias current is obtained directly. Alternatively, a processing unit, such as a CPU, of the network element may be configured to calculate the value of the control signal from the parameter values obtained from the matrix or the look-up table.

As mentioned above, the network element may comprise a plurality of diplex filters, each of the diplex filters comprising bandpass filters for different downstream and upstream frequency bands. The network element may comprise, for example, first diplex filters for the first downstream/upstream frequency bands, second diplex filters for the second downstream/upstream frequency bands and third diplex filters for the third downstream/upstream frequency bands. Thus, the network element may be used, besides for the current downstream/upstream frequency bands, such as according to DOCSIS 3.0, but also for various frequency band configurations, thereby for example anticipating an introduction of DOCSIS 3.1 and/or 4.0 whereupon the frequency ranges and the bandwidth of the downstream and upstream communication channels are adjusted to higher levels. The network element may comprise a switch for connecting the selected diplex filter so as to control the usage of desired downstream and upstream frequency bands.

According to an embodiment, the at least one amplifier unit is the last amplifier unit of the network element in upstream signal path. Hence, in a case where the upstream signal path comprises two or more amplifiers, the last return amplifier unit typically draws a significant part of the total power. Thus, the most significant benefits in terms of power reduction are obtained by adjusting the bias current of the last amplifier unit.

According to an embodiment, the network element comprises a user interface means for determining the control signal for adjusting the bias current of the upstream amplifier. Hence, alternatively or in addition to the processing unit automatically determining an appropriate control signal and adjusting the bias current of the upstream amplifier, the adjustment of the power consumption of the upstream amplifier may be performed manually. For example, a technician may perform the manual adjustment via a user interface of the network element, e.g. using a one or more buttons or a dedicated software. Alternatively, an external device may be connected to the network element for performing the manual adjustment.

According to an embodiment, said means for determining a control signal for adjusting bias current of the upstream amplifier comprises a control circuit configured to detect at least the type of the switched diplex filter and to adjust the bias current of the upstream amplifier based on the control signal.

The control circuit may be implemented for example as a FPGA or an ASIC and it may comprise a processor for executing various tasks. The control circuit may be configured to detect, in addition to the type of the switched diplex filter, also other parameters possibly affecting to the control signal, such as the upstream channel load, the attenuation values of the upstream attenuator, and the nominal input level of the upstream receiver.

Figure 2:
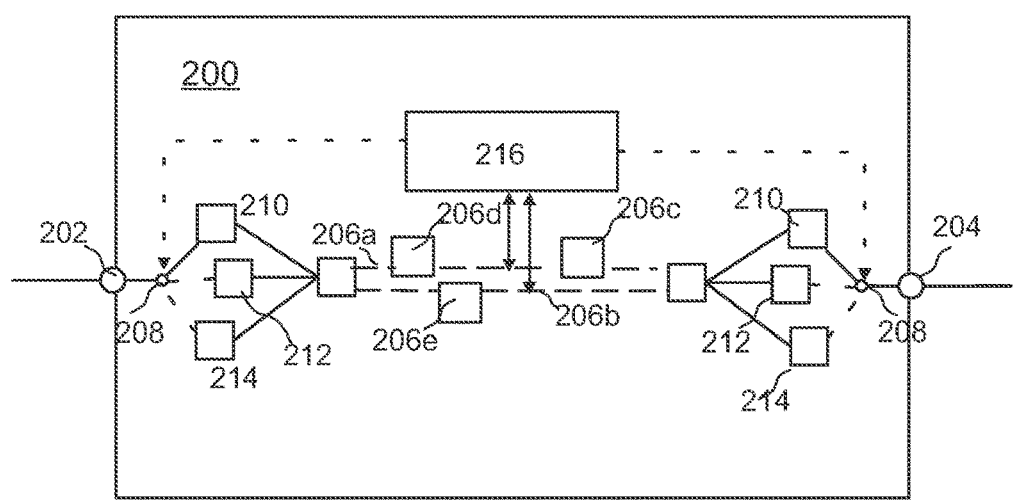
FIG. 2 shows a simplified block chart of a network element according to an embodiment of the invention.

FIG. 2 shows a simplified block chart for illustrating the embodiments. FIG. 2 shows a simplified block chart of a network element (node), wherein the embodiments may be implemented. It is noted that for exemplifying purposes, the network element of FIG. 2 is depicted as having a plurality of pre-installed diplex filters. However, the embodiments relating to detecting the type of the connected diplex filter, determining an appropriate control signal based on at least the type of diplex filter and adjusting the bias current of the upstream amplifier according to the control signal are equally applicable in a network element having only one manually changeable diplex filter.

The node 200 comprises a first input/output port 202, which operates as an input for the downstream signals originating from the headend or the CMTS or the CCAP core and an output for the upstream signals originating from the customer devices. The node 200 further comprises a second input/output port 204, which operates as an output for the downstream signals originating from the headend or the CMTS and an input for the upstream signals originating from the customer devices. Within the node, the downstream and upstream signals have their own signal routes 206a, 206b travelling at least partly through different components, including attenuators, signal inclination controllers, amplifiers, etc. Most of the internal structure of the network element is irrelevant for the implementation of the embodiments, and therefore the internal structure is not described in further detail, but only depicted by the dotted lines 206a, 206b referring to the upstream and downstream signal paths, respectively. The components on the upstream signal path may comprise at least an upstream amplifier 206c and an (optional) attenuator 206d, whereas the components on the downstream signal path are collectively referred to by numeral 206e.

Regarding the second input/output port 204 and the upstream signals originating from the customer devices, there is a switch 208 for directing the upstream signals to a diplex filter. The amplifier comprises a first diplex filter 210 arranged to provide the first (existing) upstream frequency band, such as an upstream frequency band of DOCSIS 3.0. The amplifier further comprises a second diplex filter 212 arranged to provide the second upstream frequency band, such as an upstream frequency band of DOCSIS 3.1. The amplifier may further comprise a third (or even a fourth) diplex filter 214 arranged to provide the third (or fourth) upstream frequency band, such as an upstream frequency band of DOCSIS 4.0.

It is noted that in case that the upstream and downstream signals use the same nodes as input/output ports, as shown in FIG. 2, a similar but a mirrored arrangement of a plurality of diplex filters 210, 212, 214 and a switch 208 is arranged in connection with the first input/output port 202.

The node comprises a control circuit 216 configured to detect at least the type of the switched diplex filter. The control circuit may comprise means, e.g. a uni-directional receiver or a bi-directional transponder unit, for receiving remote control signaling from the headend or the CCAP core via the downstream signal route. According to the received signaling, the control circuit 216 may control the switches 208 to select the desired diplex filter and to detect at least the type of the switched diplex filter.

The control circuit 216 may also detect other parameters affecting to the control signal, such as the upstream channel load, the attenuation value of an upstream attenuator, and in case of a DCA node being include in the node, also the nominal input level of the upstream receiver. Based on the detected parameters, the control circuit 216 may determine the control signal and adjust the bias current of the upstream amplifier 206c using the control signal In general, the various embodiments may be implemented in hardware or special purpose circuits or any combination thereof. While various embodiments may be illustrated and described as block diagrams or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

A skilled person appreciates that any of the embodiments described above may be implemented as a combination with one or more of the other embodiments, unless there is explicitly or implicitly stated that certain embodiments are only alternatives to each other.

The various embodiments can be implemented with the help of computer program code that resides in a memory and causes the relevant apparatuses to carry out the invention. Thus, the implementation may include a computer readable storage medium stored with code thereon for use by an apparatus, such as the network element, which when executed by a processor, causes the apparatus to perform the various embodiments or a subset of them. Additionally or alternatively, the implementation may include a computer program embodied on a non-transitory computer readable medium, the computer program comprising instructions causing, when executed on at least one processor, at least one apparatus to perform the various embodiments or a subset of them. For example, an apparatus may comprise circuitry and electronics for handling, receiving and transmitting data, computer program code in a memory, and a processor that, when running the computer program code, causes the apparatus to carry out the features of an embodiment.

It will be obvious for a person skilled in the art that with technological developments, the basic idea of the invention can be implemented in a variety of ways. Thus, the invention and its embodiments are not limited to the above-described examples, but they may vary within the scope of the claims.

The invention claimed is:

1. A network element of a cable television (CATV) network, said network element comprising
   an input for upstream signal transmission;
   one or more diplex filters connectable to said input, the diplex filters comprising bandpass filters for different upstream and downstream frequency bands;
   a plurality of components arranged to form an upstream signal path, wherein at least one of said components is an upstream amplifier and at least one of said components is an upstream attenuator;
   a control circuit configured to;
   detect a frequency range of an upstream filter of the diplex filter connected between said input and the upstream signal path;
   determine an attenuation value of the upstream attenuator;
   determine a control signal for adjusting bias current of the upstream amplifier, wherein the control signal is based on at least the frequency range of the upstream filter of the diplex filter and the attenuation value and a difference between an actual input level and a nominal input level of an upstream receiver of the upstream amplifier; and
   adjust the bias current of the upstream amplifier based on the control signal.

2. The network element according to claim 1, comprising a plurality of diplex filters connectable to said input; and a switch configured to switch one of said plurality of diplex filters to be connected between said input and the upstream signal path.

3. The network element according to claim 1, wherein said control circuit is configured to determine temperature compensation for gain and slope of the upstream amplifier based on the frequency range of the upstream filter of the diplex filter.

4. The network element according to claim 1, wherein said control circuit is configured to determine the channel load on the upstream frequency band, wherein the control signal is further based on at least the channel load.

5. The network element according to claim 1, wherein the network element comprises a memory configured to store a plurality of predetermined performance configurations for determining the control signal.

6. The network element according to claim 5, wherein the plurality of predetermined performance configurations comprises attenuation values of the upstream attenuator for each frequency range of the upstream filter of the diplex filters and one or more of the following parameters arranged according to the frequency range of the upstream filter of the diplex filter:

variations in channel load, such as in terms of a number and frequencies of active upstream channels;

a nominal input level of an upstream receiver;

a temperature compensation for each frequency range of the upstream filter of the diplex filters;

an indication of an optional lowpass filtering on the upstream channels for each frequency range of the upstream filter of the diplex filters.

7. The network element according to claim 1, wherein the at least one upstream amplifier is a last amplifier unit of the network element in the upstream signal path.

8. The network element according to claim 1, further comprising a user interface for determining the control signal for adjusting the bias current of the upstream amplifier.

9. The network element according claim 1, wherein the control circuit is configured to detect at least the frequency range of the upstream filter of the diplex filter and to adjust the bias current of the upstream amplifier based on the control signal.

* * * * *